United States Patent [19]
Lemke et al.

[11] Patent Number: 5,850,209
[45] Date of Patent: Dec. 15, 1998

[54] COMPUTER SYSTEM HAVING REMOTELY OPERATED INTERACTIVE DISPLAY

[75] Inventors: Gilbert Lemke, Los Gatos; Thomas H. Szolyga, Saratoga; Hossein Arjomand; John M. Santacroce, both of San Jose, all of Calif.

[73] Assignee: Hewlett-Packard Company, Palo Alto, Calif.

[21] Appl. No.: 858,288

[22] Filed: May 19, 1997

Related U.S. Application Data

[63] Continuation of Ser. No. 421,591, Apr. 12, 1995, abandoned.
[51] Int. Cl.$^6$ .............................. G09G 5/00; H06H 3/00
[52] U.S. Cl. ............................ 345/156; 345/169; 701/33
[58] Field of Search .................................. 345/2, 87, 169, 345/179, 905, 156; 395/161, 156, 147; 364/424.01, 424.03, 424.04, 500, 501.01, 514 R; 340/439, 459, 825.44; 371/29.1; 73/116, 117.2, 117.3; 248/917–923; 701/33, 99

[56] References Cited

U.S. PATENT DOCUMENTS

| | | | |
|---|---|---|---|
| 4,113,980 | 9/1978 | Bell | 73/117.2 |
| 4,644,352 | 2/1987 | Fujii | 340/825.44 |
| 4,796,206 | 1/1989 | Boscove et al. | |
| 4,962,456 | 10/1990 | Abe et al. | 364/424.03 |
| 4,964,018 | 10/1990 | Mallory et al. | 248/917 |
| 5,144,290 | 9/1992 | Honda et al. | 345/905 |
| 5,373,458 | 12/1994 | Bishay et al. | 364/708.1 |
| 5,396,422 | 3/1995 | Forchert et al. | 364/424.03 |
| 5,400,055 | 3/1995 | Ma et al. | 364/708.1 |
| 5,488,572 | 1/1996 | Belmont | 364/708.1 |
| 5,532,927 | 7/1996 | Pink et al. | 364/424.03 |
| 5,671,158 | 9/1997 | Fournier | 345/156 |

FOREIGN PATENT DOCUMENTS

| | | | |
|---|---|---|---|
| 0 419 689 A1 | 9/1989 | European Pat. Off. | G06F 1/00 |
| 0 421 630 A2 | 9/1990 | European Pat. Off. | H05K 7/18 |
| WO85/05706 | 12/1985 | WIPO | 345/169 |

OTHER PUBLICATIONS

"Hand–Held Engine Analyzer Control Box", IBM Technical Disclosure Bulletin, vol.32, No. 8A, Jan. 90, pp. 377–378.
"Dumb Terminals . . . " QSI Corporation. Dec. 8, 1994, 3 pages.
"Test Book", Model HP27070B. Hewlett–Packard Company, Palo Alto, California, Pat No. 5091–9697E, Sep. 1993.
"Scanner Cartidge" Tech–1, 1993.

Primary Examiner—Amare Mengistu

[57] ABSTRACT

A computer-based apparatus provides access to complex technical information needed, for example, to maintain and repair complicated equipment, such as a motor vehicle. The apparatus includes a processor unit and a selectively detachable remotely operated interactive display for accessing information from the processor unit and displaying the information, as well as controlling the functions of the processor unit. The processor unit and display unit communicate over a bi-directional communications cable or, alternatively, over a wireless communication link.

18 Claims, 5 Drawing Sheets

COMPUTER SYSTEM HAVING REMOTELY OPERATED INTERACTIVE DISPLAY

CROSS REFERENCE TO RELATED APPLICATION(S)

This is a continuation of application Ser. No. 08/421,591 filed on Apr. 12, 1995, now abandoned.

BACKGROUND OF THE INVENTION

The present invention relates in general to computation and display systems and, more particularly, to computers having an associated display, such as personal computers. Specifically, one embodiment of the invention is directed to a portable personal computer having a remotely operated interactive display, in which the display enables the user to control the functions of the computer and enter data through interaction with the display, as well as displays information provided by the computer. For example, one embodiment of the invention provides an interactive display selectively detachable from a portable personal computer, in which the user interacts with the display remotely from the computer to access complex technical information employed to maintain and repair complicated equipment, such as a motor vehicle, and to control instruments integrated into the computer to perform measurements on the vehicle, as well as display information to the user. Such a portable personal computer having a remotely operated interactive display is particularly useful to provide information about a motor vehicle and vehicle diagnostics to the user.

Although the portable personal computer having a remotely operated interactive display in accordance with the invention is susceptible to being used in various applications, it has been found to be particularly advantageous for use in the maintenance and repair of motor vehicles. Therefore, an embodiment of the portable personal computer having a remotely operated interactive display in accordance with the invention will be described in connection with service of a motor vehicle. However, it is to be understood that the invention is not limited to motor vehicle maintenance and repair and may also be applicable to non-motor-vehicle applications.

Today, there are various handheld testers used in connection with the maintenance and repair of motor vehicles. Typically, these testers comprise cables attached to a microprocessor-based handheld device. The cables, for example, include a cable that connects to the motor vehicle battery and another cable that connects to an electrical component to measure voltage and current, as well as a data cable that connects to the engine control module to transmit information about operation of the motor vehicle to the handheld tester or enable the tester to control various motor vehicle functions.

Unfortunately, the cables connected to the motor vehicle are typically heavy and stiff. Consequently, the handheld tester is unwieldy to operate, which is inconvenient for the user. Furthermore, the display screen on the handheld tester is typically small, and, therefore, only a minimal amount of information can be displayed to the user.

Regarding the display of information to the user, the trend in the motor vehicle service bay is toward greater access to information. This trend requires the user to have a larger display screen incorporated into his or her test equipment and many connections to the motor vehicle, as well as to a dealership local area network (LAN).

Historically, motor vehicle manufacturers have provided printed information regarding maintenance and repair. As a service to motor vehicle maintenance and repair personnel, the manufacturers provided published information, such as manuals, for reference during maintenance and repair of motor vehicles. However, published information requires a large amount of storage space.

More recently, motor vehicle manufacturers have provided maintenance and repair information on microfiche which is periodically updated. Although microfiche reduces storage requirements, microfiche can be misfiled, and microfiche readers are cumbersome to use.

Today, various computer-based systems exist for providing motor vehicle maintenance and repair information. Some of these computer-based systems also comprise instruments to perform measurements in connection with motor vehicle evaluation and diagnosis. For example, one such computer-based system is the Model HP 27070B ("TestBook"), available from Hewlett-Packard Company, Palo Alto, Calif. See, "HP TestBook," Hewlett-Packard Company Part No. 5091-9697E, September, 1993.

The TestBook system is a portable integrated personal computer and test system that provides a compact mobile test and information tool for use in the motor vehicle service bay or on a road test. The TestBook system comprises a 486-microprocessor-based personal computer, an integrated adjustable VGA liquid crystal display (LCD) panel and touchscreen interactive user interface having a capacitive touch-activated screen, and a built-in CD-ROM drive to provide faster and easier access to the latest service procedures and information for maintenance and repair of a motor vehicle. Built-in measurement instrumentation and a programmable communications interface offer a test capability for computer-aided diagnostic applications. The TestBook system can be custom-configured to meet various MS-DOS, Windows, or OS/2 application requirements.

While the TestBook system provides ready access to a large amount of information needed for maintenance and repair of a motor vehicle, cables that connect to the vehicle must be attached to the measurement instrumentation integrated into the system. Consequently, as in the case of handheld testers, the TestBook system is unwieldy and is typically set on a work surface, such as a workbench or tool chest, during use. Therefore, the user does not have ready access to the integrated interactive display of the TestBook system while he or she is under the hood of the motor vehicle.

It is therefore desirable to provide a system to facilitate access to information by a user during maintenance and repair of a motor vehicle. Furthermore, it would be desirable to provide an approach that would enable the user to control the display of information about maintenance and repair of a motor vehicle and perform needed measurements, as well as display information to the user, while he or she is under the hood of the vehicle. It would be further desirable to have an interactive information display and control system that is not encumbered with cables connected to the motor vehicle.

SUMMARY OF THE INVENTION

One embodiment of the invention comprises a portable personal computer that provides access to information and a selectively detachable, remotely operated interactive display that controls the computer and displays information accessed by the computer to a user. The portable personal computer also preferably comprises instruments to perform various measurements under control of the remotely operated interactive display. Although the portable personal computer having the remotely operated interactive display can be used for maintenance and repair of a given type of complex equipment, such as a motor vehicle, it is also contemplated that the system in accordance with the invention can be generalized to access information and control computer functions, as well as display information, necessary to assist other service providers (such as equipment operators, doctors, and others) in providing services.

A preferred embodiment of the invention provides a processor unit that provides information and can perform other functions, for example, that executes a motor vehicle maintenance and repair application program that accesses motor vehicle maintenance and repair information. The processor unit preferably has mass volumes of information stored for immediate access by the user. The processor unit also preferably comprises instruments, such as a digital volt-ohm meter (DVOM) connected to a motor vehicle, for performing measurements. The embodiment of the invention also comprises a selectively detachable, remotely operated interactive display unit. The unique attribute of the preferred embodiment of the invention is that the personal portable computer is provided with an interactive display unit that is selectively detached from the processor unit and remotely operated to control the processor unit, as well as display information accessed by the processor unit to the user.

The display unit is preferably handheld, lightweight, and has an integrated user input digitizer interface, such as a touchscreen. In accordance with one embodiment of the invention, the display unit communicates with the processor unit through a bi-directional communications cable. In accordance with another embodiment of the invention, the display unit communicates with the processor unit by a wireless communication link. Therefore, the display unit having the interactive user interface is selectively separated from the processor unit having integrated measurement instruments so that the user has greater mobility. If the display unit were not remotely operated, the user would be required to carry the additional weight of the mass storage devices and measurement instruments.

In accordance with one exemplary application of the various embodiments of the invention, the processor unit transmits information and diagnostics about a motor vehicle under evaluation or repair to the remotely operated interactive display unit. All connections to the motor vehicle are to the processor unit which can be set on a workbench, tool chest, the floor, or on an optional trolley.

The only required user interface to operate the processor unit is through the remotely operated interactive display unit. With this display unit configuration, the user has full mobility to work in and around a motor vehicle without having to manage numerous cables. Also, the remotely operated interactive display unit can be provided with a tilt stand and/or hanger selectively secured to the display unit so that the display unit can be set on or hung from the hood or other features of a motor vehicle. This frees the hands of the user to perform other tasks.

BRIEF DESCRIPTION OF THE DRAWINGS

The above and other objects and features and the concomitant advantages of the present invention will be better understood and appreciated by those skilled in the art in view of the description of the preferred embodiments given below in conjunction with the accompanying drawings. In the drawings.

DETAILED DESCRIPTION OF THE PREFERRED EMBODIMENTS

Figure 1:
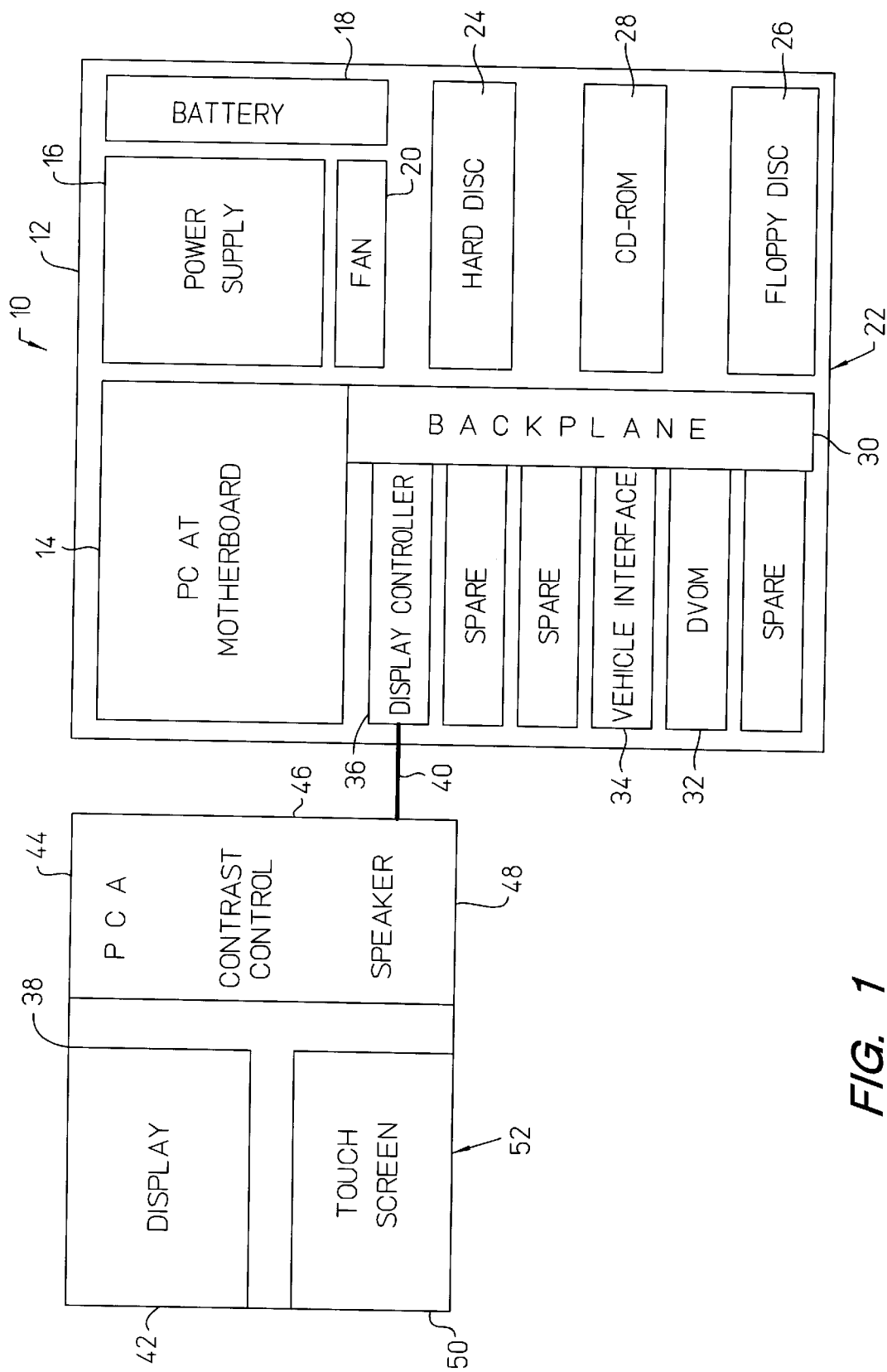
FIG. 1 is a block diagram of one embodiment of the portable personal computer system having a remotely operated interactive display in accordance with the invention.

One embodiment of the portable personal computer system having a remotely operated interactive display in accordance with the invention, generally indicated by the numeral 10, is shown in FIG. 1. The system 10 comprises a portable personal computer (PC) processor unit 12. The processor unit 12 includes a PC motherboard 14 connected to a power supply 16. The power supply 16 can be connected to an external DC power source (not shown) or to an AC power outlet (not shown). For example, in the exemplary application in which the system 10 is used for maintenance and repair of a motor vehicle, the power supply 16 can be connected to the vehicle battery (not shown). Preferably, a rechargeable backup battery pack 18 is connected to the power supply 16 to supply needed power for short-term operation of the system 10 in case the external power to the processor unit 12 is interrupted or disconnected. The processor unit 12 also comprises a cooling fan and dust filter assembly 20 for preventing overheating of the processor unit and to positively pressurize an enclosure 22 for the processor unit to prevent dust from entering the enclosure.

The processor unit 12 further comprises a hard disc drive 24. The hard disc drive 24 is provided to store the operating system and application programs executed by a microprocessor resident on the PC motherboard 14, as well as information for display to the user. Additionally, the processor unit 12 can comprise a floppy disc drive 26 and/or a CD-ROM drive 28. The floppy disc drive 26 and CD-ROM drive 28 are preferably incorporated to provide mass volumes of information for access by the user.

The processor unit 12 also comprises a backplane 30 connected to the PC motherboard 14. The backplane 30 provides standard ISA expansion slots, including expansion slots for various measurement instruments used for a given application. For example, in the case of motor vehicle maintenance and repair, the backplane 30 preferably provides an expansion slot for a digital volt-ohm meter (DVOM) card 32 to which are connected various cables from the electrical systems of a motor vehicle for measurement of voltages and currents needed to be measured in connection with evaluation and diagnosis of a vehicle. The backplane 30 also provides an expansion slot for a vehicle communication interface (VCI) card 34 which provides a bi-directional data communications link between an engine control module on a motor vehicle, that is, the vehicle on-board computer, and the processor 12. The backplane 30 also provides an expansion slot for a multi-function video display controller card 36 which provides the interface between the processor unit 12 and a selectively detachable, remotely operated interactive display unit 38. Finally, there are preferably additional expansion slots that will be described in more detail later.

As shown in FIG. 1, the display unit 38 is connected to the processor unit 12 through a bi-directional communications cable 40. The display unit 38 comprises a screen 42.

Preferably, the screen 42 is a backlighted liquid crystal display (LCD) panel. The display unit 38 also comprises a printed circuit assembly (PCA) 44 which is connected to the screen 42 and comprises drivers for the screen. Additionally, the printed circuit assembly 44 preferably comprises a contrast control 46 for adjusting the contrast of the screen 42. Furthermore, the printed circuit assembly 44 preferably comprises an audio transducer 48, such as a speaker. Finally, the display unit 38 comprises a user input digitizer interface 50 integrated with the screen 42. For example, the user input digitizer interface 50 can be a touchscreen interface or a pen-based magnetic or resistive grid.

The system 10 is a two-box, portable tester platform configuration with the display unit 38 selectively detachable from the processor unit 12 and remotely operated. That is, the system 10 has two main components, namely, the processor unit 12 and the display unit 38. The processor unit 12 integrates a standard 486 microprocessor system, the hard disc drive 24 and other optional mass storage devices, optional PCMCIA slots, and measurement instruments in the enclosure 22. The processor unit 12 can reside on an optional trolley. The display unit 38 integrates the screen 42, which is preferably an LCD panel, and a user input digitizer interface 50, such as a touchscreen input interface, in a lightweight enclosure 52.

In one implementation for motor vehicle maintenance and repair, the system 10 is a portable personal computer, AT compatible diagnostic tool configured to withstand the harsh environment of a motor vehicle dealership service bay. The processor unit 12 of the system 10 comprises standard PC-AT expansion slots for the DVOM card 32 and the VCI card 34, as well as to provide internal future expendability, such as a CAN/VAN interface. The DVOM interface and VCI interface are preferably controlled by respective dedicated microcontrollers. The processor unit 12 comprises the internal rechargeable backup battery pack 18 to facilitate the transition from service bay test to road test. Ease of use is enhanced by the separated display unit 38 having an integrated touchscreen user input digitizer interface 50. All cable connections to the DVOM interface and VCI interface are between the processor unit 12 and the motor vehicle. This frees the user from dealing with the motor vehicle cable connections on a conventional handheld tester, as will be described in more detail later.

The processor unit 12 can be implemented as follows. Preferably, there are three basic configurations, which will be described shortly.

The PC motherboard 14 is preferably a standard, PC-AT compatible printed circuit assembly in the 2/3 Baby AT form factor with integrated input/output (I/O). I/O ports on the PC motherboard 14 include Integrated Drive Electronic (IDE) hard disc, floppy disc, serial, and parallel. There is a four or six slot ISA backplane 30 in the form of a board plugged vertically into the PC motherboard 14. This means that the I/O cards are mounted horizontally, that is, parallel to the PC motherboard 14. The slots on the backplane 30 are used for the DVOM card 32, the VCI card 34, the multi-function video display controller card 36 which includes the LCD panel and user input digitizer interface, an optional floppy disc drive, an optional enhanced IDE CD-ROM drive, and an optional PCMCIA adapter. This leaves zero, one, or two slots open for expansion, depending upon the configuration. The serial and parallel port connectors are panel mounted. The PCMCIA slots are implemented by a controller card with the PCMCIA sockets extending from this card to the outside of the enclosure 22 of the processor unit 12.

Considered in more detail, the PC motherboard 14 of the processor unit 12 is the main system board and comprises a personal computer compatible motherboard that forms the central core of the system 10. The PC motherboard 14 provides PC-AT compatible functionality on a single printed circuit board.

The PC motherboard 14 can comprise an Intel 8086 architecture microprocessor, such as a 486 or Pentium device. For example, the microprocessor can be an SL-Enhanced 486SX which runs at a clock rate of 25 MHz, available from Intel Corporation. The SL-Enhanced 486SX microprocessor is a 32-bit internal device, with a 32-bit external address bus and a 32-bit external data bus. This microprocessor integrates eight kbyte of internal cache memory onto the chip to improve performance. The microprocessor is socketed in a PGA package and can be upgraded to any five-volt 486SX, SX2, DX, or DX2 microprocessor. For example, the microprocessor is upgradable to 66 MHz 486DX2. The PC motherboard 14 also comprises a Basic Input Output System (BIOS) EPROM.

The software environment for the system 10 is preferably a windows-based software interface, such as Microsoft Windows 1995 (Chicago). Also, the system 10 is capable of running MS-DOS 6/Windows 3.1 and Windows NT.

The PC motherboard 14 also comprises on-board random access memory (RAM). For example, the PC motherboard 14 can comprise four Mbyte of dynamic RAM (DRAM) extendable to 16 Mbyte. Preferably, the four Mbyte of DRAM is expandable with 72-pin SIMMs (×36) to 16 Mbyte.

As indicated earlier, the PC motherboard 14 also comprises integrated I/O ports. The I/O ports include an IDE hard disc interface, a floppy disc interface, a serial interface, and a parallel interface, as well as an external keyboard port. The PC motherboard 14 also comprises four or six ISA I/O expansion slots used for the DVOM card 32, the VCI card 34, the multi-function video display controller card 36, an optional floppy disc card, an optional enhanced IDE CD-ROM card, an optional PCMCIA controller card, and one I/O slot is VEAS VL-Bus capable.

The external interfaces are preferably implemented as follows. The PC motherboard 14 comprises a standard external Centronics 8-bit bi-directional interface. The processor unit 12 comprises an external Centronics parallel port which includes a Centronics parallel connector, that is, a DB25 connector, mounted to a panel incorporated into the enclosure 22 of the processor unit and cabled to the integrated I/O of the PC motherboard 14. The Centronics port can be used to connect the processor unit 12 to peripherals, such as a parallel printer. The Centronics parallel interface is not isolated.

In addition, the PC motherboard 14 also preferably comprises a standard external RS-232 serial interface. The processor unit 12 comprises an external RS-232 serial port which includes an RS-232 serial connector, namely, a DB9 connector, mounted to the panel incorporated into the enclosure 22 of the processor unit and cabled to the integrated I/O of the PC motherboard 14. The RS-232 serial port can be used to allow host communication with a peripheral, such as a serial printer. The RS-232 serial interface is not isolated.

Furthermore, the PC motherboard 14 also preferably comprises a standard external keyboard interface to connect an external standard keyboard (not shown) to the system 10. The processor unit 12 comprises an external keyboard port which includes a keyboard connector, namely, a 6-pin mini-DIN connector, mounted to the PC motherboard 14 to enable connection of a standard keyboard. The external keyboard interface is not isolated.

As indicated earlier, the processor unit 12 comprises the multi-function video display controller card 36. The video interface of the system 10 is implemented as a multi-function card that plugs into one of the expansion sots. It includes a VGA LCD display controller with a 512-kbyte video memory and user input digitizer interface 50. This interface is not isolated.

The basic configurations of the processor unit 12 are as follows. All configurations of the system 10 include a mass storage device which is preferably a hard disc drive. For example, the mass storage device can be an IDE hard disc drive with a 120-Mbyte capacity. This 2.5-inch form factor hard disc drive is contained inside the enclosure 22 of the processor unit 12. The hard disc drive 24 can be upgraded to the IDE limit of 540 Mbyte.

In one configuration, the processor unit 12 comprises no floppy disc drive or CD-ROM drive. In the configuration in which there is no floppy disc or CD-ROM drive, the riser of the backplane 30 has six slots with two open slots. The hard disc drive 24 is included in the configuration. The processor unit 12 also includes PCMCIA slots implemented on a PCMCIA controller card.

In another configuration, the processor unit 12 comprises the floppy disc drive 26 as another mass storage device. In the floppy disc drive configuration in which there is a floppy disc drive, the riser card of the backplane 30 has six slots with one open slot. The floppy disc drive 26 is preferably a standard 3.5 inches by one inch tall with a 1.44-Mbyte capacity and occupies the space from the sixth I/O card. The floppy disc drive 26 is connected to the floppy disc controller on the PC motherboard 14. The hard disc drive 24 is also included in the configuration. The processor unit 12 includes PCMCIA slots implemented on the PCMCIA controller card.

In yet another basic configuration, the processor unit 12 comprises the floppy disc drive 26 and the CD-ROM drive 28 as additional mass storage devices. In the floppy disc and CD-ROM drive configuration, the riser card of the backplane 30 has six slots with no open slots. The floppy disc drive 26 is a standard 3.5 inches by one inch tall. The CD-ROM drive is 5.25 inches by one inch tall and preferably comprises a standard enhanced IDE interface. The CD-ROM drive 28 is connected to an enhanced IDE interface plugged into one of the expansion slots. The CD-ROM drive 28 is low profile, caddyless, and has a 2× transfer rate. Both drives occupy the space from the fifth and sixth I/O cards. The enhanced IDE controller card occupies one of the I/O slots. The hard disc drive 24 is included in the configuration. The processor unit 12 does not include PCMCIA slots.

As indicated earlier, the processor unit 12 accommodates an optional PCMCIA interface in various configurations. The optional PCMCIA interface is a PCMCIA controller card that plugs into one of the expansion slots on the backplane 30. The PCMCIA slots are preferably provided with a cover. Sockets for the PCMCIA cards are mounted on the PCMCIA controller card. The PCMCIA cards are inserted into the PCMCIA sockets on the PCMCIA controller card through the I/O card mounting bracket. The PCMCIA controller card accepts two type I/II or one type III 68-pin PCMCIA cards. The PCMCIA interface is not isolated.

The processor unit 12 also comprises all instruments to perform measurements. The measurement instruments preferably comprise standard data acquisition interfaces. There are preferably two data acquisition interfaces contained in the enclosure 22 of the processor unit 12. One of the interfaces is the VCI interface and the other is the DVOM interface. Both interfaces are standard ISA interfaces that can be replaced or upgraded.

In order to facilitate the field upgrade of the system 10, the two measurement instrument interfaces are configured to be user or field installable modules. There are two module positions in the chassis of the processor unit 12. Each module comprises a case surrounding the interface card. The user need not be concerned about handling a computer interface card, since the module case protects the electronics on the interface card.

The VCI module, as well as the DVOM module, are implemented on respective plug-in ISA I/O cards. The VCI and DVOM modules reside on the PC motherboard 14 plugged into respective expansion slots. The VCI card 34 is generally custom to each application, so its configuration will not be described in detail.

The DVOM card 32 will now be described in more detail. As indicated earlier, the DVOM circuit preferably resides on the PC motherboard 14. The DVOM circuit interfaces to the 486 microprocessor system via one of the expansion slots. Connection to a motor vehicle is provided by a multi-conductor connector of approximately 15 pins which mate with a matching probe cable assembly.

In one implementation, the DVOM card 32 can be a Model HP Z1062-60002 DVOM card, available from Hewlett-Packard Company. The DVOM card 32 is an intelligent 68HC16 microcontroller-based subsystem. Firmware for the DVOM measurement instrument is preferably stored in a flash EPROM.

The DVOM card 32 preferably comprises a high-density DB15 signal connector for analog probes. The DVOM card 32 additionally comprises an electrically isolated serial port.

The DVOM circuit comprises one channel for data acquisition for a measurement. The DVOM circuit comprises a fast analog-to-digital converter (ADC). The DVOM circuit provides an electrically isolated analog measurement interface having a high input impedance so that the data acquisition channel is electrically isolated from the remainder of the system 10. The DVOM circuit preferably has a 32-kbyte buffer.

The DVOM circuit is preferably provided with overvoltage and overcurrent protection. For example, a fuse can be incorporated into the DVOM circuit.

As indicated earlier, the DVOM comprises one measurement input channel. This channel comprises one measurement input and one return input. Inputs are accessible at one multi-contact input connector of approximately 15 pins.

The measurement input channel can also be used for optional accessories, such as adapters/transducers, external shunts, attenuators, and other accessories. In this regard, transducer power is provided through the multi-contact connector. The voltages provided on the connector for powering transducers and accessories are preferably current-limited.

The input impedance of the DVOM circuit for voltage measurement functions is 10 Mohms resistive. This value was selected to minimize the DVOM load effect on the circuit under test. The input impedance for resistance measurements depends upon the selected measurement range.

As indicated earlier, electrical isolation is provided for the DVOM circuit so that the measurement input channel is electrically isolated from the remainder of the system 10. No significant measurable current will flow, except between the measurement and return connections of the measurement channel as determined by the input impedance.

Also, as indicated earlier, the DVOM comprises overvoltage and overcurrent protection. Protection is provided for the system 10, the motor vehicle, and the user from damage or harm due to application of voltages or currents beyond the maximum measurement ranges of the DVOM card 32. When the DVOM circuit is measuring voltage, overvoltage protection clamps internal voltages while dropping excess voltage across a large value series resistance which can be less than the described input resistance. Overvoltage protection during resistance measurement draws current through a fuse and/or other current limiting device and can require replacement of an accessible fuse or other easily accessible component by the user.

The DVOM card 32 enables measurement of voltage, resistance, and current. The DVOM circuit also provides a diode test capability, as well as a cable ID resistor capability.

Several hardware voltage and resistance ranges are provided within the overall voltage and resistance range of the DVOM card 32 as required to meet accuracy and resolution specifications. Low level software functions permit application programs to select either fixed ranges or automatic range selection.

As indicated earlier, a user serviceable internal fuse can be provided as part of the overvoltage protection circuit during resistance measurement. Also, a user serviceable internal fuse can be provided as part of the overcurrent protection circuit during current measurement.

As also indicated earlier, the DVOM firmware is preferably stored in flash memory. This provides firmware upgrade by flash reprogramming instead of physical read only memory (ROM) replacement. The DVOM firmware is interrupt driven and manages and performs all measurement functions.

The DVOM software provides the required interface between the 486 microprocessor system of the processor unit 12 and the DVOM microcontroller. This library can be compatible with MS-DOS, MS-Windows, and Windows NT.

The system 10 is preferably configured to perform system self-test diagnostics that execute each time that the processor unit 12 is powered on. The diagnostics determine the status of the 486 microprocessor, the RAM, the ROM, the LCD controller and memory, and the IDE hard disc drive interface. The system 10 executes each of the various self tests until either a successful boot or an error occurs. If an error occurs, the user can review documentation that is provided with the system 10 to determine the appropriate action to resolve the error. If no error occurs, the system 10 boots into its normal operating mode.

In accordance with the embodiment of the invention shown in FIG. 1, all connections between the system 10 and a motor vehicle are between the vehicle and the processor unit 12. The connections between the processor unit 12 and the motor vehicle are preferably fully isolated. The power supply 16 comprises a DC-to-DC converter which isolates the processor unit 12 from the motor vehicle power and ground connections. The DVOM card 32 has an isolated analog input stage to isolate the measurement instrument of the processor unit 12 from the motor vehicle electrical system. The VCI card 34 has an isolated analog/digital input stage to isolate the vehicle communication interface of the processor unit 12 from the motor vehicle. In contrast, the other ports (serial, parallel, enhanced IDE, PCMCIA, etc.) of the processor unit 12 are not isolated.

The power supply 16 is DC powered by a fully isolated DC-to-DC converter. The battery backup pack 18 supplies power to the power supply 16 during powerfail conditions. The enclosure 22 of the processor unit 12 which houses the power supply 16 contains a cooling fan and dust filter assembly 20 and is vented to ambient air.

The power supply 16 will now be described in detail. The power supply 16 is an internal DC power supply that can be externally powered from the motor vehicle or from an optional external AC wall module (not shown) connected to an AC power outlet.

The power supply 16 comprises an isolated DC power input connector. The DC-to-DC converter of power supply 16 is fully isolated and can be connected directly across the motor vehicle battery terminals or plugged directly into a cigarette lighter receptacle. In this mode of operation, the DVOM and VCI isolations maintain the motor vehicle battery ground isolated from the computer ground. The isolated DC-to-DC converter provides the ground isolation for the peripheral connectors, such as the parallel and serial ports.

When connected to the motor vehicle, the power supply 16 uses DC power from the vehicle with an input voltage range of 9 volts DC to 16 volts DC. Also, the power supply 16 can be powered from an optional external AC wall module. The optional external AC wall module for the system 10 is autoranging, 90 to 260 volts AC, 50 or 60 Hz input. The output to power the system 10 is 16 volts DC at 4.5 amperes. An IEC AC power cord is optional.

If the motor vehicle power is lost or the system 10 is disconnected from the vehicle or from the optional external AC wall module, the power supply 16 operates from the backup battery pack 18. The backup battery pack 18 is a standard rechargeable nicad backup battery pack. The rechargeable backup battery pack 18 is integrated into the enclosure 22 of the processor unit 12.

A standard backup battery pack charging circuit (not shown)is also preferably incorporated into the enclosure 22 of the processor unit 12. The charging circuit is preferably implemented on a small printed circuit board mounted to the chassis of the processor unit 12. The charging circuit only charges when the external DC input is at least 13.8 volts DC (normal running voltage of a motor vehicle) or when connected to an AC power outlet. The charging circuit preferably provides adaptive nicad charging and delivers a quick charge in less than two hours.

The power supply 16 also preferably comprises a lithium battery pack. The lithium battery pack backs up the real-time system clock/calendar and configuration RAM on the PC motherboard 14.

The system 10 also preferably comprises power indicators. In one implementation, the processor unit 12 comprises a green "POWER ON" indicator (not shown). This indicator is incorporated into a power on/off switch (not shown) located on the processor unit 12. The power on/off switch is preferably a single-pole, single-throw rocker or toggle switch. Preferably, the power on/off switch is illuminated brightly if the power supply 16 is connected to a motor vehicle battery or an AC power outlet and less brightly if the power supply is being powered by the backup battery pack 18. Alternatively, a green light can be provided to indicate that the power supply 16 is being externally powered and the backup battery pack 18 is being recharged and an orange light when power is being supplied by the backup battery pack.

The display unit 38 is preferably implemented as follows. The display unit 38 is the handheld user interface portion of the system 10. The display unit 38 contains the LCD screen 42, the user input digitizer 50 along with associated support circuitry, the audio transducer 48, and a two-position membrane keypad that comprises the contrast control 46 for adjusting the contrast of the screen.

In the embodiment shown in FIG. 1, the display unit 38 communicates with the processor unit 12 over the bi-directional communications cable 40. For example, the bi-directional communications cable 40 can be a thin, flexible multi-conductor cable comprising a twisted pair terminated transmission line from the processor unit 12 to the display unit 38. The length of the cable 40 is from 2 to 3 meters (8 to 10 feet). As will be described later, in another embodiment shown in FIG. 5, the display unit 38 can be modified to communicate with the processor unit 12 over a radio-frequency (RF) wireless transmission link.

The screen 42 of the display unit 38 preferably comprises a standard LCD panel. In one implementation, the screen 42 can be a passive monochrome 9.6-inch LCD panel, such as a model DMF50260NF-FW5, available from Optrex. This LCD panel has VGA-compatible resolution of 640×480 pixels. The display area is approximately 13 cm wide by 17 cm long. The LCD panel has a typical response time of 290 ms. The screen 42 is preferably edge lit with CCFT backlighting and has typical brightness of 90 nits, which is brighter than the screen of a typical laptop personal computer. The display modes include graphic, as well as text modes. For example, the screen 42 can emulate an oscilloscope display to display waveforms.

As shown in FIG. 1, the display unit 38 comprises the contrast control 46. The contrast control 46 for the screen 42 comprises membrane switches that form a keypad. The membrane switches provide a limited number of keys for LCD panel contrast control. For example, the keys preferably comprise two keys, namely, "CONTRAST UP" and "CONTRAST DOWN."

The display unit 38 also comprises the user input digitizer 50 which preferably includes a touchscreen input interface in the form of a standard finger touchscreen. The technology used to implement the touchscreen interface is preferably a resistive touch system in which a transparent sheet contains a matrix of resistive touch input switches. The user compresses a touch switch point to cause a touch press input.

In one implementation, the user input digitizer 50 is a transparent, continuous analog, X-Y resistive touchscreen constructed using five-wire resistive technology. Approximately 65–75% of the light emitted by the screen 42 is transmitted through the touchscreen input interface.

In addition to the visual display provided by the screen 42, the display unit 38 preferably comprises the audio transducer 48, such as a speaker. The operation of the speaker can be limited to touch clicks and error beeps that are originated by the system BIOS. For example, the speaker can be used for such purposes as key press error, parameter out of range, and other prompts, such as low battery. The programming techniques used to activate the speaker are PC-compatible.

The mechanical configuration of the system 10 will now be described in detail. This mechanical configuration employs advanced ergonomics/industrial design technology.

Figure 2:
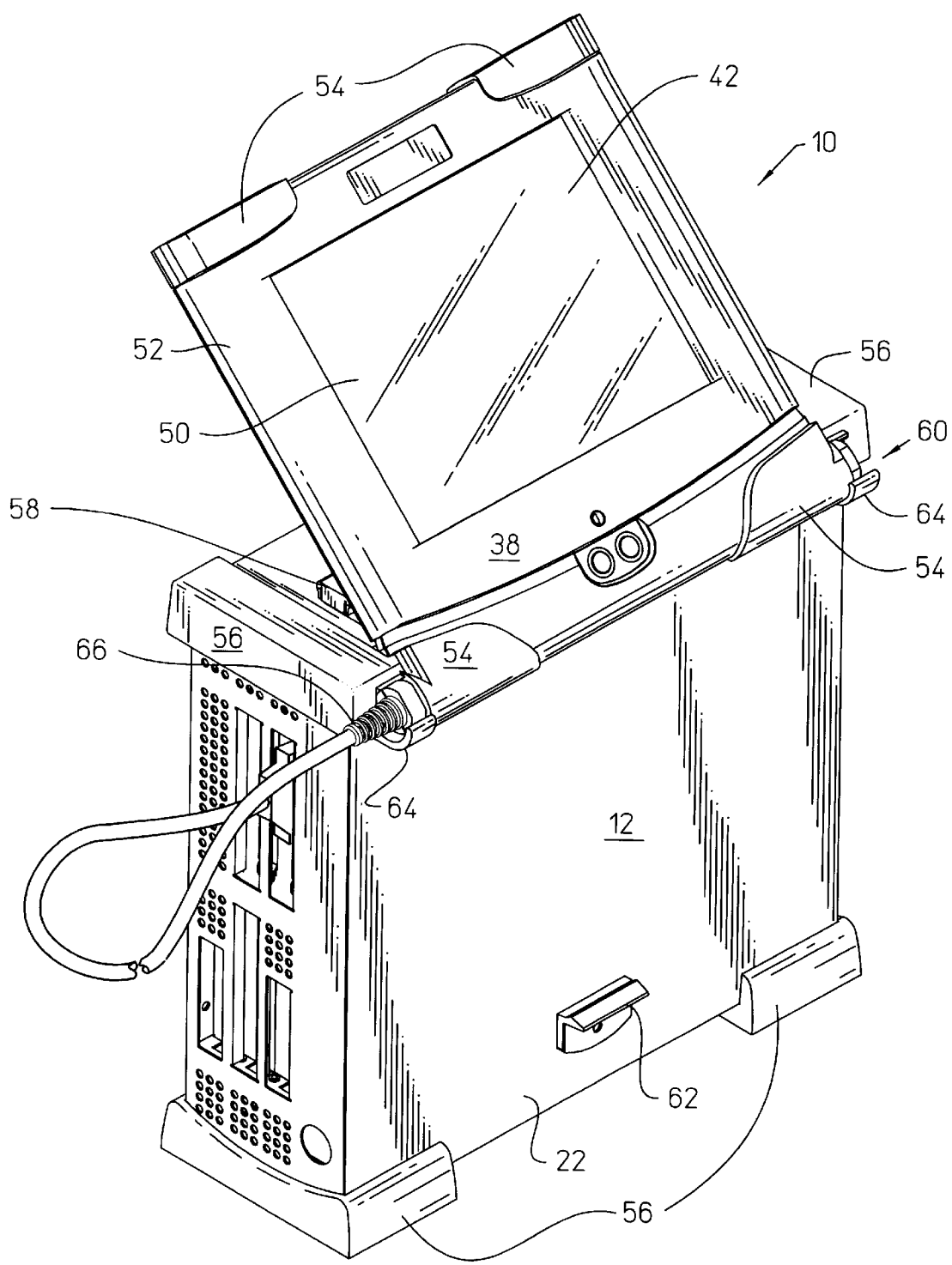
FIG. 2 shows one implementation of the system shown in FIG. 1.

As indicated earlier, the system 10 comprises two main components, the processor unit 12 and the display unit 38, as shown in FIG. 2. The enclosure 22 of the processor unit 12 and the enclosure 52 of the display unit 38 are preferably painted and molded in black or black grey to camouflage dirty and greasy fingerprints.

The enclosure 52 of the display unit 38 houses the screen 42, such as an LCD panel, user input digitizer interface 50, blacklight inverter, and interconnect wiring. The enclosure 52 is preferably constructed from thermoplastic, such as mild plastic which is durable, shock resistant, and chemical resistant. Elastomeric bumpers 54 can be provided on the enclosure 52.

One implementation of the display unit 38 had the following mechanical specifications. The thickness of the display unit 38 was 26 mm (1.03 inches). The display unit 38 had a width of 281 mm (11.06 inches). The length of the display unit 38 was 263 mm (10.35 inches). The approximate weight of the implementation of the display unit 38 was 2.0 pounds.

The enclosure 22 of the processor unit 12 houses all other electronics. Specifically, the enclosure 22 contains the PC motherboard 14, DVOM card 32, VCI card 34, multi-functional video display controller card 36, a spare ⅔ size AT slot, hard disc drive 24, power supply 16, cooling fan and dust filter assembly 20, and internal brackets to secure the components.

Importantly, motor vehicle test and I/O connectors are located on the processor unit 12 to free the user from cables connected to the vehicle and peripheral devices. All connectors are standard connectors. The connectors are preferably provided with connector covers.

The enclosure 22 of the processor unit 12 preferably consists of sheet metal parts that form a protective environment for the main electronics. Covers on the processor unit 12 can be easily removed for service. The enclosure 22 can also comprise elastomeric bumpers 56 at strategic locations to absorb shock from accidental drops. There is preferably a handle 58 at the top of the enclosure 22 for transporting the system 10.

One implementation of the processor unit 12 had the following mechanical specifications. The thickness of the processor unit 12 was 109 mm (4.3 inches). The processor unit 12 had a width of 317 mm (12.48 inches). The length of the processor unit 12 was 319 mm (12.5 inches).

Preferably, cooling is provided for the processor unit 12 and the display unit 38. The enclosure 52 of the display unit 38 is provided with cooling vents having filters to the ambient surroundings. The enclosure 22 of the processor unit 12 includes an opening (not shown). The cooling fan and dust filter assembly 20 is mounted to the opening in the enclosure 22 to draw cooling air into the enclosure of the processor unit 12. The dust filter for the air intake is easily replaceable by the user. Air is exhausted from the enclosure 22 through vents to the ambient surroundings.

Also, the display unit 38 is provided with a storage location on the processor unit 12. The display unit 38 is mechanically attached to the processor unit 12 through a hinge assembly 60 which allows the screen 42 to be angled for normal use, folded down for transporting, or removed for remote usage. The display unit 38 can be rotated in the hinge assembly 60 from a closed, latched storage position 225 degrees to an open, operational position, as shown in FIG. 2. The display unit 38 can also be placed so that the screen 42 faces away from the processor unit 12 to allow the user to interact with the display unit without holding the display unit. The display unit 38 can also be stored with the screen 42 facing the processor unit 12 to protect the screen during transport.

Considered in more detail, the selectively detachable display unit 38 can dock to the processor unit 12 in different orientations to produce at least three possible operating and/or transport configurations. In a first position, the display unit 38 is retained in the hinge assembly 60 and is folded backwards so that a user can place the system 10 on a desk in front of him or her and interact with the display unit while looking at the screen 42. In this configuration, the system 10 of the present invention resembles a conventional notebook computer.

In a second position, the display unit 38 is mounted on top of the processor unit 12 with display side of the screen 42 outward. In this configuration, the system 10 provides a unit which can be carried in one hand, with the screen 42 exposed. Thus, the user can set the system 10 on a work surface in a service bay or on the seat of a motor vehicle during a road test and interact with the display unit 38 with one hand, as desirable for a touchscreen- or stylus-operated computer.

In a third position, the display unit 38 is folded flat against the processor unit 12 with the back of the screen 42 (non-display) side facing outward. A latch is also provided between the processor unit 12 and the display unit 38 in this position. The latch can comprise a bracket 62 mounted on the processor unit 12, which releasably engages the lip of display unit 38. This configuration provides a conveniently stable and durable closed position for transporting the system 10.

The unique feature of the hinge assembly 60 is the ability to allow removal of the display unit 38 from the processor unit 12 by simply rotating the display unit to a removal position and lifting the display unit from pivot hooks 64 incorporated into the hinge assembly 60 and mounted to the processor unit. As a safety feature, the display unit 38 is captured by the pivot hooks 64 and allowed to pivot but not be removed at any other position, unless forced by the user.

Figure 3:
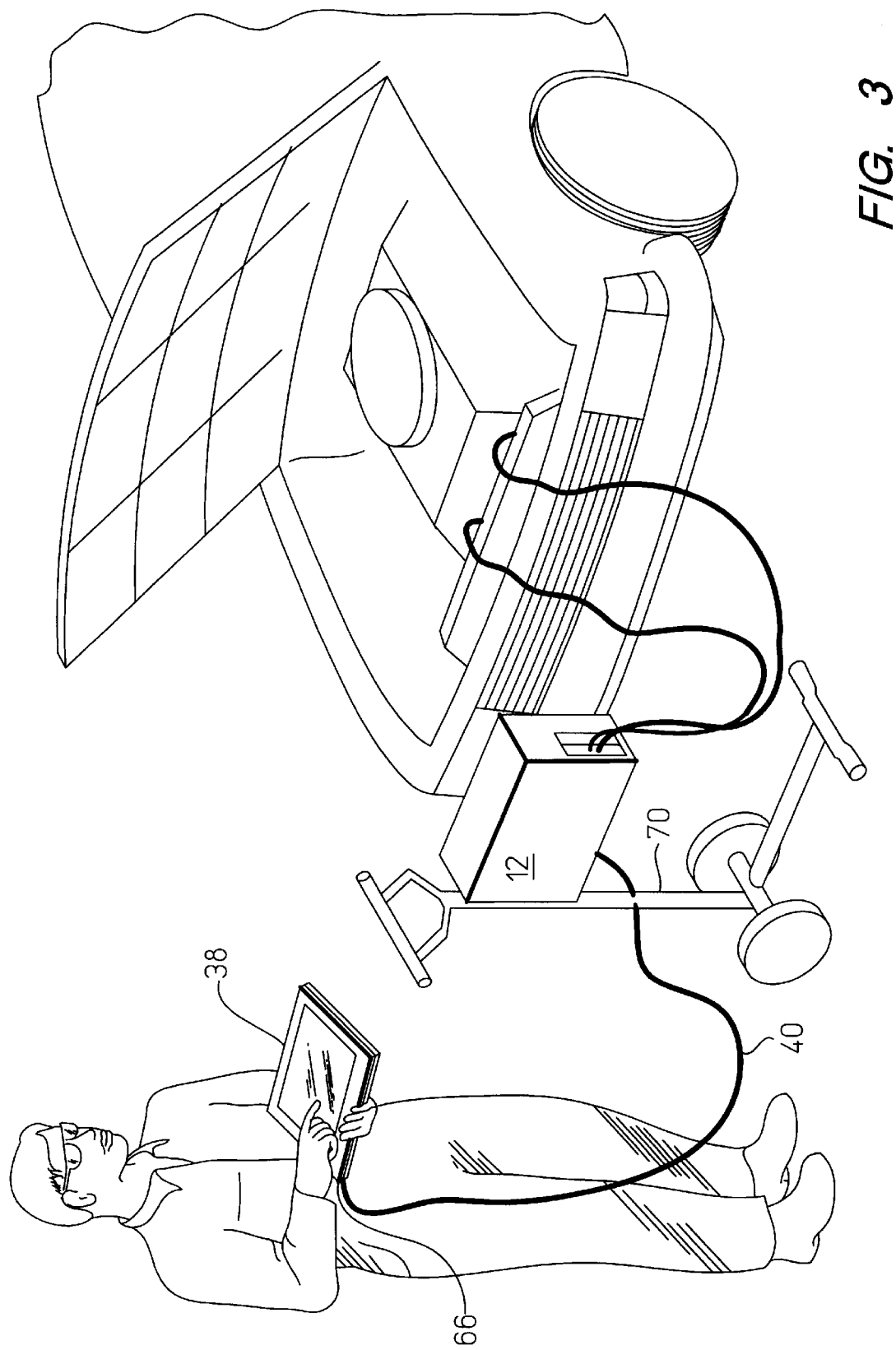
FIG. 3 illustrates an exemplary deployment of the system shown in FIG. 1.
Figure 4:
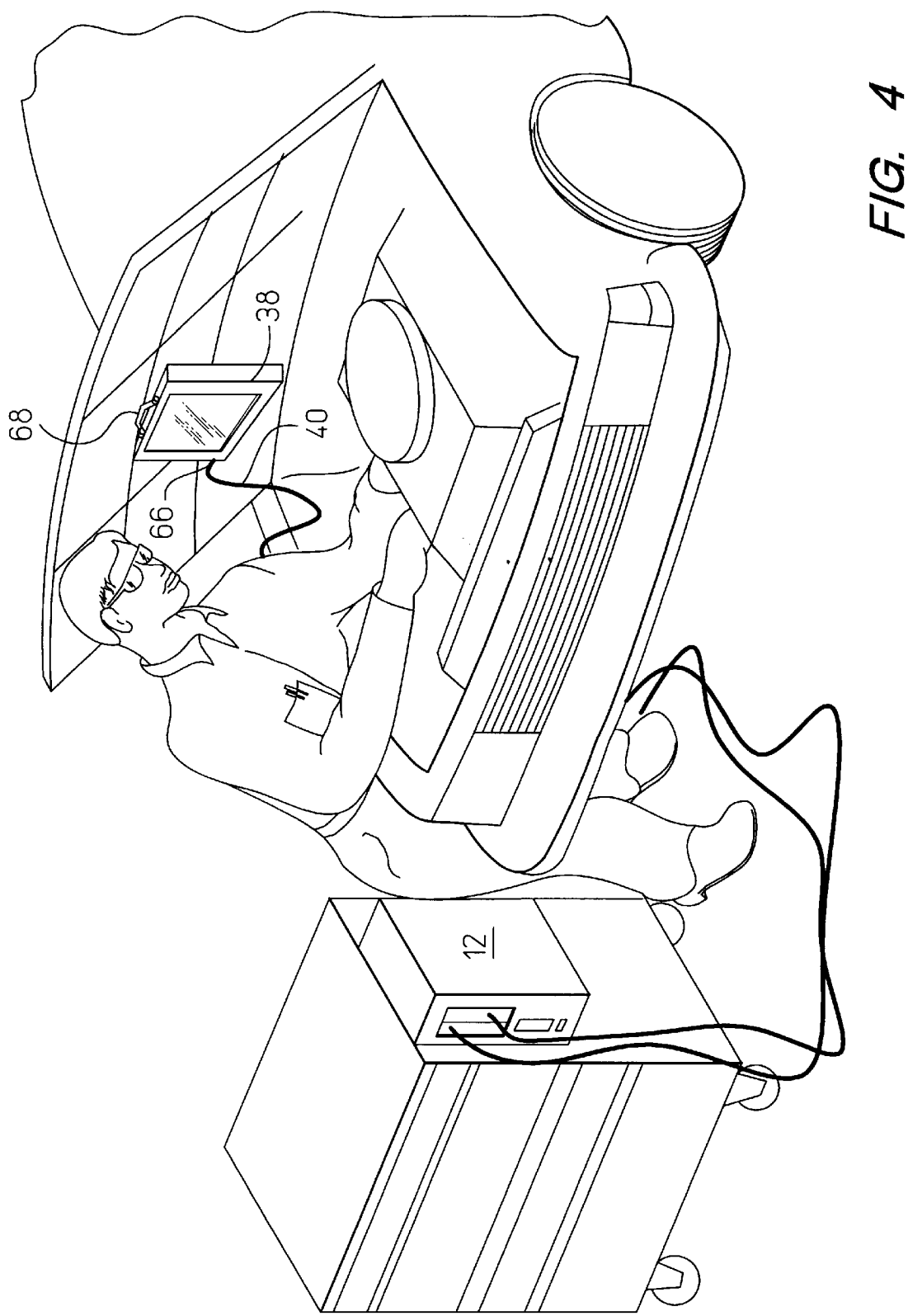
FIG. 4 illustrates another exemplary deployment of the system shown in FIG. 1.

As shown in FIG. 3 the display unit 38 is tethered to the processor unit 12 with the bi-directional communications cable 40, allowing the display unit to be easily moved around a motor vehicle. Preferably, a pivot attachment 66 is provided on the display unit 38 for attachment of the bi-directional communication cable 40 to the display unit. The display unit 38 is lightweight, handheld or armheld. Additionally, the display unit 38 preferably comprises a tilt stand or hanger selectively secured to the display unit, for example, by means of a Velcro connection, so that the display unit can be set on or hung from the hood or other features of a motor vehicle, as shown in FIG. 4.

An optional portable trolly can serve as a support for the processor unit 12 and the display unit 38, as shown in FIG. 3. The system 10 can also be mounted to a roll around tool chest or located on the top of a workbench.

The system 10 is provided with various cables and adapters. Preferably these cables and adapters for the system 10 include a VCI cable, a battery power cable, and a DVOM roving probe cable. Preferably, these cables are configured to operate in the harsh motor vehicle service bay environment. Each cable and adapter will now be briefly described.

The VCI cable connects the VCI interface of the processor unit 12 to the motor vehicle diagnostic connector. The VCI cable is approximately 2.5 meters long and has 20 conductors that are 24 AWG. The VCI cable has an overall braided shield with 85% coverage. The outer jacket is preferably a black PVC. Each end of the VCI cable is provided with molded strain relief, which is also constructed from PVC. At one end of the VCI cable, a standard DB9 connector with thumb locking screws is attached. A user specific diagnostic connector is connected to the other end. Both ends of the VCI cable are preferably overmolded in PVC.

The battery power cable connects the power supply 16 to the battery of a motor vehicle. The battery power cable is approximately three meters long. The battery power cable has standard red and black battery clamps at one end. The other end of the battery power cable connects to a power jack provided with black PVC molded strain relief.

The DVOM roving probe cable connects the DVOM interface of the processor unit 12 to a desired point of measurement. The DVOM roving probe cable is shielded and is constructed from chemically resistant materials. The DVOM roving probe cable is approximately three meters long. The DVOM roving probe cable has a standard DB-15 connector at one end for connection to the processor unit 12 and probes attached at the other end for connection to various test points on a motor vehicle.

Finally, an optional cigarette lighter cable can be provided to connect the power supply 16 to the motor vehicle cigarette lighter receptacle. The cigarette lighter cable is approximately three meters long. The cigarette lighter cable has a power jack connector at one end to connect to the processor unit 12 and a standard cigarette lighter adapter at the other end.

The system 10 meets all requirements for electromagnetic interference, product safety, hazardous classification, and environmental testing. The system 10 conforms to international requirements for safety of construction and electrical design, electromagnetic interference, electromagnetic susceptibility, acoustic noise, environmental specifications, and ergonomics. These requirements include suitability for use in a Class I hazardous environment, since the system 10 can be used in a motor vehicle dealership service bay environment. The system 10 also complies with international requirements for electromagnetic emissions and immunity performance, such as FCC Level A and EN55022 1988 (CISPR22) Class 1 requirements. Since the enclosure 52 of the display unit 38 consists of thermoplastic, supplemental treatment of the interior surface of the enclosure to provide shielding is included in order to comply with the requirements. Since the enclosure 22 of the processor unit 12 is constructed from metallic materials, due to the conductive properties of these materials, supplemental treatment is not typically necessary. Gaskets can be provided if compliance testing proves that they are needed.

A particularly advantageous application of the system 10 is motor vehicle maintenance and repair, as shown in FIGS. 3 and 4. Information presentation is key, as well as diagnostics. The hard disc drive 24, floppy disc drive 26, and CD-ROM drive 28 of the processor unit 12 store information. These mass storage devices provide a technical database comprised of stored information records comprising a structured electronic library with hypertext links. Consequently, there is migration capability between related records to provide selective access to particular portions of information within the database. Moreover, there is also access to measurement data acquired by the measurement instruments, such as DVOM measurement data.

The system 10 facilitates customer service of a motor vehicle. The system 10 provides various advantages, such as reduced service time, improved fault identification, and better parts utilization. The system 10 enables reduced overall warranty costs.

The system 10 also permits motor vehicle manufacturers access to information directly from dealers and customers. The system 10 provides an opportunity to collect service feedback and marketing information. Service trends can be detected early, so design changes can be made quickly to minimize cost impact to the motor vehicle manufacturer. Marketing information can be collected to obtain customer profiles and demographics or to determine when the customer might be ready to purchase a new motor vehicle.

Figure 5:
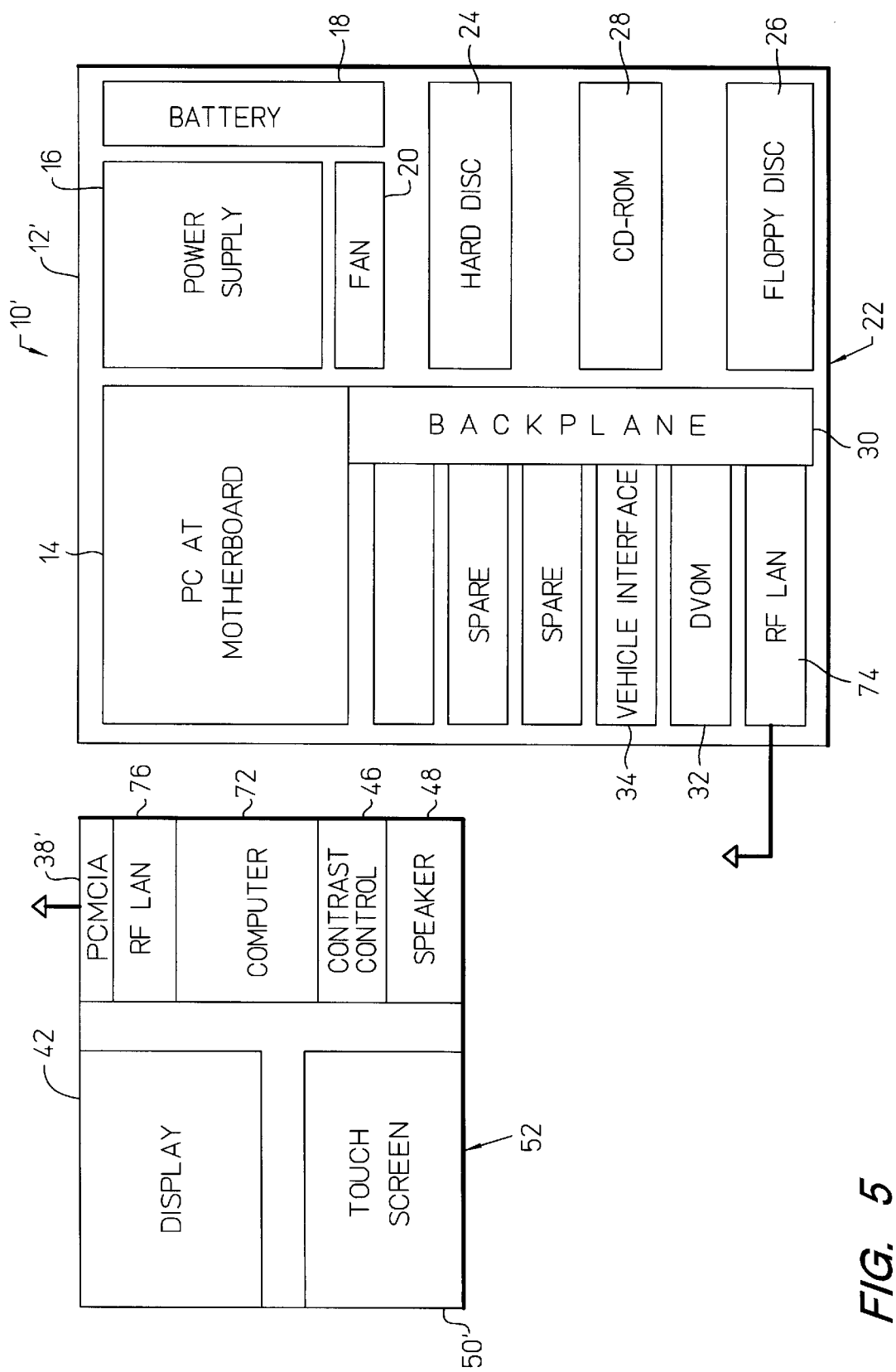
FIG. 5 is a block diagram of another embodiment of the portable personal computer system having a remotely operated interactive display in accordance with the invention.

As shown in FIG. 5, in another embodiment of the portable personal computer having a remotely operated interactive display unit, generally indicated by the numeral 10', a wireless display unit 38' is provided. Basically, the system 10' is a portable personal computer equipped with wireless communication components.

In FIGS. 1 and 5, like reference numerals designate corresponding elements. Therefore, only the differences between the system 10 shown in FIG. 1 and the system 10' shown in FIG. 5 will be described.

The display unit 38' is an intelligent sub-system with its own on-board computer 72. The display unit 38' is the user interface to the system 10'. The display unit 38' provides the user with any or all visual, audible, and/or tactile means by which to communicate to the remainder of the system 10'. The display unit 38' provides information to the user and receives commands from the user to process or communicate to the processor unit 12' by wireless communication. The display unit 38' can be supplied with power from the battery of a motor vehicle or from an internal power source.

In one implementation of the system 10', the processor unit 12' comprises a standard ISA RF LAN card 74, available from PROXIM, installed in one of the PCMCIA ports on the processor unit. The processor unit 12' can also comprise a standard ISA LAN card (not shown) connected to a wired dealership LAN.

The display unit 38' can be a VERSA PAD battery-operated computer tablet, available from NEC. Alternatively, the computer tablet can be powered from a motor vehicle battery. This computer tablet has an LCD panel, pen-based user input digitizer interface 50' to emulate the touchscreen interface of the display unit 38 shown in FIG. 1, and built-in PCMCIA ports. The display unit 38' shown in FIG. 5 further comprises a standard PCMCIA RF LAN card 76, also available from PROXIM, inserted into one of the PCMCIA ports of the display unit. Additionally, the processor unit 12' and the display unit 38' each further comprise a user interface device driver (UIDD) to capture the user interface information from the display unit and transmit that information to the processor unit and return display and speaker information from the processor unit to the display unit.

The software for the system 10' is preferably a Windows For Workgroup (WFWG) operating environment. The WFWG is installed in both the processor unit 12' and the display unit 38'.

In operation, as information targeted for the display unit 38' is received by the processor unit hardware (a display controller with no real output), the UIDD of the processor unit 12' captures and transmits this information over the RF LAN to the display unit 38', resulting in update of the screen 42 and speaker sound. The touch inputs generated by the user with the pen on the user input digitizer interface 50' of the display unit 38' are captured by the UIDD that resides on the display unit and transmitted over the RF LAN to the processor unit 12' to access information and control the functions of the processor unit.

It will be understood that the embodiments of the present invention described above are susceptible to various modifications, changes, and adaptations. For example, the PC motherboard 14 can also comprise a standard external VGA interface to connect an external display (not shown) to the system 10 or 10'. Additionally, in one contemplated modification, the system 10 has the option of including an active matrix, 9.6-inch color LCD panel as the screen 42. However, the resulting display unit 38 would be thicker, and the bi-directional communications cable 40 shown in FIG. 1 would be larger. In a contemplated modification of the system 10', the display unit 38' could comprise a pair of glasses and a head piece that a user would wear, with a built-in screen and microphone connected to the on-board computer 72 of the display unit preferably attached to the clothing of the user or strapped to the user. The glasses would provide normal viewing like an ordinary pair of glasses, as well as have the built-in screen. This version of the display unit 38' would free both hands of the user, since information would be viewed through the glasses and the system 10' would be commanded by the user via voice commands detected by the microphone. The modified display unit 38' could also be equipped with a small handheld pointing device (a mouse emulator) to provide an interactive display unit and a speaker for audible feedback. Although the various embodiments of the system in accordance with the invention are particularly advantageous for motor vehicle service, the system may also be applicable to non-motor-vehicle environments. It is also contemplated that the system in accordance with the invention can be generalized to access information necessary to assist other service providers (such as equipment operators, doctors, and others) in providing services. All is intended to be comprehended within the meaning and range of equivalents of the appended claims.

What is claimed is:

1. A portable computer system, comprising:
   a portable computer processor unit for providing access to a technical database comprised of stored information records, with migration capability between related records, and further to provide selective access to particular portions of information within the database said process or unit having a housing comprising planar, substantially rectangular front and back surfaces spaced apart by adjoining, contiguous edges to define a substantially cubic volume; and
   an interactive display unit removably joined to said portable computer processor unit and in communication therewith, said display unit comprising a screen to display information communicated by said processor unit, said display unit further comprising a user interface responsive to operation by a user to provide commands to said processor unit;
   wherein, in a first configuration, said display unit is operably joined to said processor unit and in a second configuration said display unit is operably detached from said processor unit, such that said display unit provides remote and in situ communication with said portable computer processor unit; and
   wherein said processor unit comprises a storage location for said display unit when said display unit is in said first configuration, said processor unit further comprising a hinge assembly for mechanically attaching said display unit to said processor unit said hinge assembly comprising two points of attachment to said housing at coaxial locations substantially along one housing edge, said points of attachment spaced apart from each other substantially at either extreme of said housing edge, said hinge assembly being operable to alternatively position said display unit at a first position in which said display unit is retained in said hinge assembly with the face of said display unit facing inward relative to said processor and with said display unit folded backwards, allowing said display unit to be angled for normal use as with a conventional notebook computer, a second position in which said display unit is mounted on top of said processor unit with the face of said display unit facing outward relative to said processor, wherein said processor may be carried with one hand with said display exposed; and a third position in which said display unit is folded flat against said processor unit with the face of said display facing inward for transporting.

2. The system of claim 1, further comprising means for selectively detachably mounting the display unit to the processor unit.

3. The system of claim 2 wherein a hinge assembly provides selectable detachability.

4. The system of claim 1 wherein the processor unit and the display unit communicate over a bi-directional communications cable.

5. The system of claim 4 wherein the bi-directional communications cable extends from a pivot attachment on the display unit.

6. The system of claim 4 wherein the processor unit comprises mass storage and measurement devices, and connections to the measurement devices are provided on the processor unit.

7. The system of claim 1 wherein the processor unit and the display unit communicate over a wireless transmission link.

8. The system of claim 7 wherein the processor unit comprises mass storage and measurement devices, and connections to the measurement devices are provided on the processor unit.

9. The system of claim 1 wherein the display unit further comprises an audio transducer.

10. The system of claim 1 wherein the processor unit comprises mass storage and measurement devices, and connections to the measurement devices are provided on the processor unit.

11. The system of claim 10 wherein the measurement devices comprise a digital volt-ohm meter.

12. The system of claim 1, further comprising elastomeric bumpers on the processor unit and the display unit.

13. The system of claim 1 wherein the processor unit is a portable personal computer to facilitate use of the system in a service bay as well as during a road test of a motor vehicle.

14. The system of claim 1 wherein the system is a motor vehicle maintenance and repair system.

15. The system of claim 1, wherein said processor further comprises a backplane having at least one expansion slot defined therein.

16. The system of claim 15, wherein said expansion slot is adapted for connection to either of a measurement instrument or an expansion card.

17. The system of claim 15, wherein said expansion slot is adapted for connection to a video display controller card configured to provide an interface between said portable computer processor unit and said display unit.

18. A computer-implemented method for providing information to maintain and repair equipment or provide services, comprising the steps of:

supplying a portable computer processor unit for providing access to a technical database comprised of stored information records, with migration capability between related records, and further providing selective access to particular portions of information within said database said process or unit having a housing comprising planar, substantially rectangular front and back surfaces spaced apart by adjoining, contiguous edges to define a substantially cubic volume; and removably joining an interactive display unit to said portable computer processor unit, such that said interactive display unit is in communication with said processor unit, said display unit comprising a screen to display information communicated by said processor unit, said display unit further comprising a user interface responsive to operation by a user to provide commands to said processor unit;

wherein, in a first configuration, said display unit is operably joined to said processor unit and in a second configuration said display unit is operably detached from said processor unit, such that said display unit provides remote and in situ communication with said portable computer processor unit; and wherein said processor unit comprises a storage location for said display unit when said display unit is in said first configuration, said processor unit further comprising a hinge assembly for mechanically attaching said display unit to said processor unit, said hinge assembly comprising two points of attachment to said housing at coaxial locations substantially along one housing edge, said points of attachment spaced apart from each other substantially at either extreme of said housing edge said hinge assembly being operable to alternatively position said display unit at a first position in which said display unit is retained in said hinge assembly with the face of said display unit facing inward relative to said processor and with said display unit folded backwards, allowing said display unit to be angled for normal use as with a conventional notebook computer, a second position in which said display unit is mounted on top of said processor unit with the face of said display unit facing outward relative to said processor, wherein said processor may be carried with one hand with said display exposed; and a third position in which said display unit is folded flat against said processor unit with the face of said display facing inward for transporting.

* * * * *